United States Patent
Stiens et al.

(10) Patent No.: US 11,286,570 B2
(45) Date of Patent: Mar. 29, 2022

(54) COATED CUTTING TOOL

(71) Applicant: WALTER AG, Tubingen (DE)

(72) Inventors: Dirk Stiens, Tubingen (DE); Thorsten Manns, Tubingen (DE)

(73) Assignee: WALTER AG, Tubingen (DE)

( * ) Notice: Subject to any disclaimer, the term of this patent is extended or adjusted under 35 U.S.C. 154(b) by 0 days.

(21) Appl. No.: 16/473,477

(22) PCT Filed: Jan. 26, 2018

(86) PCT No.: PCT/EP2018/051950
§ 371 (c)(1),
(2) Date: Jun. 25, 2019

(87) PCT Pub. No.: WO2018/138255
PCT Pub. Date: Aug. 2, 2018

(65) Prior Publication Data
US 2020/0002819 A1    Jan. 2, 2020

(30) Foreign Application Priority Data
Jan. 26, 2017 (EP) ..................................... 17153338

(51) Int. Cl.
*C23C 28/04* (2006.01)
*B23B 27/14* (2006.01)
(Continued)

(52) U.S. Cl.
CPC .......... *C23C 28/044* (2013.01); *B23B 27/148* (2013.01); *C23C 16/34* (2013.01);
(Continued)

(58) Field of Classification Search
None
See application file for complete search history.

(56) References Cited

U.S. PATENT DOCUMENTS 5,597,543 A * 1/1997 Zeiringer ............ C01B 21/0602
423/380
8,389,134 B2 3/2013 Van Den Berg et al.
(Continued)

FOREIGN PATENT DOCUMENTS

CN       1939715 A    4/2007
CN     104532238 A    4/2015
(Continued)

*Primary Examiner* — Frank J Vineis
*Assistant Examiner* — Nicole T Gugliotta
(74) *Attorney, Agent, or Firm* — Corinne R. Gorski

(57) ABSTRACT

A coated cutting tool includes a substrate and a coating. The coating has an inner layer of 4-14 μm thick $Ti_{1-x}Al_xN$, an intermediate layer of 0.05-1 μm TiCN and at least one outer layer of 1-9 μm $\alpha$-$Al_2O_3$. The $\alpha$-$Al_2O_3$ layer exhibits an X-ray diffraction pattern, as measured using CuKα radiation and theta-2theta scan. A texture coefficient TC(hkl) is defined according to Harris formula, wherein the (hkl) reflections used are (0 2 4), (1 1 6), (3 0 0) and (0 0 12), I(hkl)=measured intensity (peak intensity) of the (hkl) reflection, I0(hkl)=standard intensity according to ICDD's PDF-card No. 00-042-1468, n=number of reflections used in the calculation, and 3<TC(0 0 12)<4.

14 Claims, 1 Drawing Sheet

(51) Int. Cl.
*C23C 16/34* (2006.01)
*C23C 16/36* (2006.01)
*C23C 16/40* (2006.01)
*C23C 30/00* (2006.01)

(52) U.S. Cl.
CPC ............ *C23C 16/36* (2013.01); *C23C 16/403* (2013.01); *B23B 2228/105* (2013.01)

(56) References Cited

U.S. PATENT DOCUMENTS

| | | | | |
|---|---|---|---|---|
| 2009/0011195 | A1* | 1/2009 | Bruce | .................... C23C 28/322 |
| | | | | 428/174 |
| 2014/0193624 | A1 | 7/2014 | Stiens et al. | |
| 2016/0333473 | A1* | 11/2016 | Stiens | ...................... C23C 16/46 |
| 2017/0189967 | A1* | 7/2017 | Paseuth | ................. C23C 28/042 |
| 2018/0305811 | A1* | 10/2018 | Fukunaga | ......... C23C 16/45578 |

FOREIGN PATENT DOCUMENTS

| | | | | |
|---|---|---|---|---|
| CN | 105714268 A | | 6/2016 | |
| EP | 1905870 A2 | * | 2/2008 | ............. C23C 16/00 |
| EP | 2902528 A1 | | 8/2015 | |
| EP | 30009213 | * | 3/2016 | ............. C23C 16/00 |
| WO | 2015114049 A1 | | 8/2015 | |
| WO | WO2015/135802 A1 | * | 9/2015 | ............. C23C 16/36 |

\* cited by examiner

COATED CUTTING TOOL

RELATED APPLICATION DATA

This application is a § 371 National Stage Application of PCT International Application No. PCT/EP2018/051950 filed Jan. 26, 2018 claiming priority to EP 17153338.3 filed Jan. 26, 2017.

TECHNICAL FIELD

The present invention relates to a tool having a base body of cemented carbide, cermet, ceramics, steel, cubic boron nitride or high-speed steel and a single-layer or multi-layer wear protection coating deposited by a CVD process and having a thickness within the range of 5 µm to 24 µm, wherein the wear protection coating comprises at least a $T_{1-x}Al_xN$ layer with $0.40 \leq x \leq 0.95$ having a thickness in the range of 4 µm to 14 µm and having >90 vol-% face-centered cubic (fcc) crystal structure. The present invention further relates to a process for the production of the inventive tool.

BACKGROUND ART

Cutting tools for metal cutting operations such as drilling, milling and turning need to be highly wear resistant and oxidation resistant since they are typically used in very abrasive and heat generating operations. Coated cutting tools are known in the art and hard material layers may be applied by PVD and/or CVD.

U.S. Pat. No. 8,389,134 discloses a CVD coated cutting tool comprising an $Al_2O_3$ outer layer and an inner $T_{1-x}Al_xN$ layer.

OBJECT OF THE INVENTION

The object of the present invention is to provide coated tools for the chip forming metal machining of steel or cast materials, which exhibit, compared to the prior art, improved wear resistance and improved comb crack resistance in dry machining, as well as under the use of coolant. Another object is to provide a coated cutting tool suitable for turning in steel.

DESCRIPTION OF THE INVENTION

The present invention relates to a coated cutting tool comprising a substrate and a coating, wherein the coating comprises an inner layer of 4-14 µm thick $T_{1-x}Al_xN$, an intermediate layer of 0.05-1 µm TiCN and at least one outer layer of 1-9 µm $\alpha t$-$Al_2O_3$, wherein said $\alpha$-$Al_2O_3$ layer exhibits an X-ray diffraction pattern, as measured using CuKα radiation and theta-2theta scan, and the texture coefficient TC(hkl) is defined according to Harris formula $$TC(hkl) = \frac{I(hkl)}{I0(hkl)} \left[ \frac{1}{n} \sum_{i=0}^{n} \frac{I(hkl)}{I0(hkl)} \right]^{-1}$$

wherein the (hkl) reflections used are (0 2 4), (1 1 6), (3 0 0) and (0 0 12), I(hkl)=measured intensity (peak intensity) of the (hkl) reflection, 10(hkl)=standard intensity according to ICDD's PDF-card No. 00-042-1468, n=number of reflections used in the calculation, and in that 3<TC(0 0 12)<4.

The cutting tool is a tool for chip metal cutting and can for example be a drill, a mill or an insert for drilling, milling or turning. The cutting tool is preferably an insert for turning, preferably for turning in steel.

The wear resistant coating on the cutting tool of the present invention comprises a highly wear resistant $T_{1-x}Al_xN$ layer and a very crater wear resistant $\alpha$-$Al_2O_3$ layer. These two layers are the layers that contributes most to the wear resistance of the coating of the cutting tool. The coating can comprise further layers to for example improve the adhesion of layers and/or improve the visual appearance of the coated cutting tool. Such additional layers can for example be TiN, TiCN, TiAlN, TiCO, TiCNO, AlTiCNO, AlTiCO etc.

The intermediate layer of TiCN is relatively thin, only 0.05-1 µm. The aim of this TiCN layer is to provide a good adhesion and a suitable starting layer for the subsequent wear resistant $\alpha$-$Al_2O_3$ layer. In one embodiment of the present invention the thickness of the intermediate layer of TiCN is 0.05-0.3 µm. The TiCN layer is typically very thin in relation to the $\alpha$-$Al_2O_3$ layer and/or to the $T_{1-x}Al_xN$ layer.

In one embodiment of the present invention the TC(111) of the intermediate layer of TiCN is >3, wherein the texture coefficient TC (111) is defined as follows, $$TC(111) = \frac{I(111)}{I_0(111)} \left[ \frac{1}{n} \sum_{n=1}^{n} \frac{I(hkl)}{I_0(hkl)} \right]^{-1}$$

wherein I(hkl) are the intensities of the diffraction reflections measured by X-ray diffraction, $I_0$(hkl) are the standard intensities of the diffraction reflections according to the pdf card 00-042-1489, n is the number of reflections used in the calculation, and for the calculation of TC(111) the reflections (111), (200), (220) and (311) are used.

The intermediate TiCN layer is preferably in epitaxial relation to the $T_{1-x}Al_xN$ layer, i.e. crystal grains continue to grow with the same orientation through these layers instead of renucleations at the interface. This is preferred both due to a high adhesion but also since a high degree of orientation can be perceived. A high degree of orientation, i.e. high TC values, are advantageous in that it provides high wear resistance.

In one embodiment of the present invention the Σ3 grain boundary length to the total grain boundary length in the $\alpha$-$Al_2O_3$ layer is >30%. The grain boundary length is measured with EBSD on a polished surface of the $\alpha$-$Al_2O_3$ layer. The polished surface is parallel to the surface of the substrate. The Σ3 grain boundaries are considered to contribute to high wear resistance of the $\alpha$-$Al_2O_3$ layer. In one embodiment the EBSD measurement is performed at a remaining layer thickness of 30% to 70% of the thickness of the $\alpha$-$Al_2O_3$ layer, preferably in about the middle of the $\alpha$-$Al_2O_3$ layer thickness.

In one embodiment of the present invention the $T_{1-x}Al_xN$ layer has at least 90 vol-%, preferably at least 95 vol-%, particularly preferably about 98 vol-% face-centered cubic (fcc) crystal structure.

In one embodiment of the present invention the $T_{1-x}Al_xN$ layer has a columnar microstructure.

In one embodiment of the present invention precipitations of $Ti_{1-y}Al_yN$ are present at grain boundaries of the $T_{1-x}Al_xN$ crystallites, said precipitations having a higher Al content than the inside crystallites and comprise AlN with hexagonal crystal structure (hcp) wherein y>x.

In one embodiment of the present invention the $T_{1-x}Al_xN$ layer has stoichiometric coefficients of $0.60 \leq x \leq 0.90$.

In one embodiment of the present invention the $T_{1-x}Al_xN$ layer has a preferred orientation of the crystal growth with respect to the crystallographic {111} plane, characterized by a texture coefficient TC (111)>3, preferably >3.5, wherein the texture coefficient TC (111) is defined as follows:

$$TC(111) = \frac{I(111)}{I_0(111)} \left[\frac{1}{n}\sum_{n=1}^{n} \frac{I(hkl)}{I_0(hkl)}\right]^{-1}$$

wherein

I(hkl) are the intensities of the diffraction reflections measured by X-ray diffraction, $I_0$(hkl) are the standard intensities of the diffraction reflections according to the pdf card 00-046-1200, n is the number of reflections used in the calculation, and for the calculation of TC(111) the reflections (111), (200), (220) and (311) are used.

In one embodiment of the present invention the thickness of the TiCN layer is 0.1-0.3 µm, preferably 0.1-0.2 µm.

In one embodiment of the present invention the average aspect ratio of the TiCN grains of the TiCN layer is ≤1, wherein the aspect ratio is defined as the height (i.e. layer thickness) to the width ratio.

In one embodiment of the present invention the thickness of the $T_{1-x}Al_xN$ layer, $t(Ti_{1-x}Al_xN)$, in relation to the thickness of the $\alpha$-$Al_2O_3$ layer, $t(\alpha)$, is $t(T_{1-x}Al_xN):t(\alpha)$ from 2:1 to 3:1. These thickness relations have shown advantageous in increased wear resistance.

In one embodiment of the present invention the coating comprises an innermost layer of TiN, preferably with a thickness of 0.1-2 µm, preferably 0.2-1 µm or 0.2-0.5 µm. This innermost layer is deposited directly on the substrate. This innermost layer is preferably in direct contact with the $T_{1-x}Al_xN$ layer.

In one embodiment of the present invention the coating comprises an intermediate layer of TiN between the $T_{1-x}Al_xN$ and the TiCN. The thickness of this intermediate TiN layer is preferably 0.05-0.1 µm. This intermediate TiN layer is preferably in direct contact with the $Ti_{1-x}Al_xN$ layer. This intermediate TiN layer is preferably in direct contact with the TiCN layer.

The substrate can be made of cemented carbide, cermet, steel, ceramic, cubic boron nitride or high-speed steel. In one embodiment of the present invention the substrate is of cemented carbide. The cemented carbide preferably has a binder phase content of 4-9 wt %. The cemented carbide preferably comprises 80-90 wt % WC. The cemented carbide preferably comprises Co in the binder phase.

EXAMPLES

Deposition Process

Figure 1:
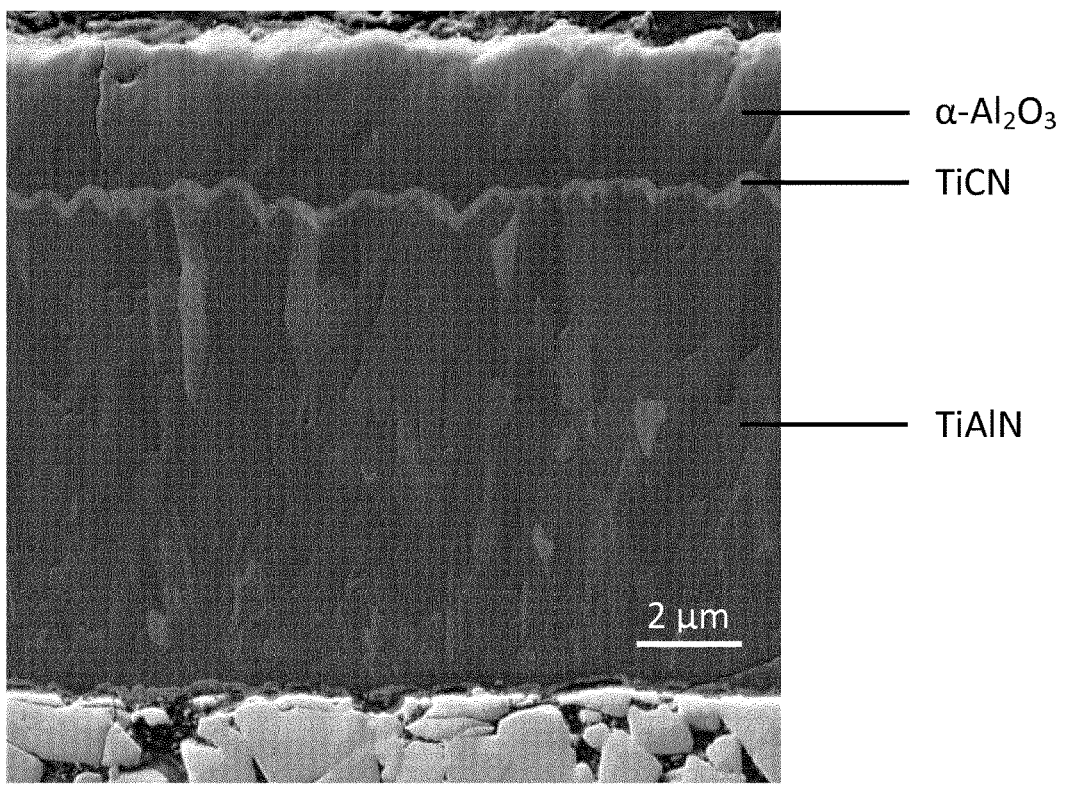
FIG. 1 shows a scanning electron microscope (SEM) image of through cut of the sample A1 (invention).

In the present examples substrates of cemented carbide with the cutting inserts geometry CNMA120408 were used. The cemented carbide composition was 86.1 wt % WC, 5.5 wt % Co, 8.0 wt % (NbC, TaC and TiC) and 0.4 wt % other carbides. The substrates have a binder phase enriched surface zone of about 20 µm.

The substrates were CVD coated in a CVD coating chamber of type Bernex BPX325S with a reactor height of 1250 mm, a reactor diameter of 325 mm and a volume of charge of 40 litres.

The example coatings according to the invention and the reference have been obtained using the herein described equipment and the process conditions as given in the following tables 1a, 1b, 2a and 2b. However, it is well known in the art that the process conditions to produce CVD coatings may to a certain degree vary depending on the equipment used. It is therefore within the purview of the person skilled in the art to modify the deposition conditions and/or the equipment used to achieve the coating properties of the present invention.

Sample A1 (Invention):

The substrates were deposited with a coating of the following layers starting from the surface of the substrate: 0.25 µm TiN, 9.0 µm $T_{1-x}Al_xN$, 0.075 µm TiN, 0.3 µm TiCN, 3.2 µm $\alpha$-$Al_2O_3$. The deposition conditions are shown in Table 1a1 and 1b1.

The basic TiN layer was deposited at a temperature of 850° C. on the substrate. The reaction gases comprise $TiCl_4$, $N_2$, $H_2$.

The $T_{1-x}Al_xN$ layer was deposited at a temperature of 725° C. The reaction gases comprise $TiCl_4$, $AlCl_3$, $NH_3$, $H_2$.

The intermediated TiN layer is then deposited directly on top of the $T_{1-x}Al_xN$ layer at a temperature of 725° C. The reaction gases comprise $TiCl_4$, $NH_3$, $H_2$.

The TiCN layer is then deposited directly on top of the intermediate TiN layer at a temperature of 850° C. The reaction gases comprise $TiCl_4$, $CH_3CN$, $N_2$, $H_2$.

As a bonding layer the TiCN layer was oxidized in an oxidation step using CO, $CO_2$ and $H_2$.

The $\alpha$-$Al_2O_3$ layer is then deposited on top of the bonding layer at a temperature of 850° C. The reaction gases comprise $AlCl_3$, $CO_2$, $H_2$, HCl, $H_2S$, CO. The deposition of the $\alpha$-$Al_2O_3$ layer was carried out in two deposition steps, wherein in the first step a nucleation layer is grown, and in the second step the $\alpha$-$Al_2O_3$ layer is grown to the desired thickness.

TABLE 1a1

| Process parameters during deposition on Sample A1 | | | |
| --- | --- | --- | --- |
| Layer | Temp [° C.] | Pressure [mbar] | Time [min] |
| TiN | 850 | 150 | 60 |
| $Ti_{1-x}Al_xN$ | 725 | 8 | 90 |
| TiN | 725 | 8 | 3 |
| TiCN | 850 | 75 | 5 |
| Oxidation | 850 | 75 | 5 |
| $\alpha$-Al2O3 | 850 | 75 | 20 |
| $\alpha$-Al2O3 | 850 | 75 | 210 |

TABLE 1b1

Reaction gases during deposition on Sample A1

| Layer | TiCl$_4$ | N$_2$ | H$_2$ | CH$_3$CN | NH$_3$ [vol %] | AlCl$_3$ | CO$_2$ | CO | H$_2$S | HCl |
|---|---|---|---|---|---|---|---|---|---|---|
| TiN | 1.03 | 44.0 | 55.0 | 0 | 0 | 0 | 0 | 0 | 0 | 0 |
| Ti$_{1-x}$Al$_x$N | 0.019 | 0 | 99.4 | 0 | 0.41 | 0.17 | 0 | 0 | 0 | 0 |
| TiN | 0.15 | 0 | 99.1 | 0 | 0.72 | 0 | 0 | 0 | 0 | 0 |
| TiCN | 1.60 | 9.8 | 88.2 | 0.42 | 0 | 0 | 0 | 0 | 0 | 0 |
| Oxidation | 0 | 0 | 87.7 | 0 | 0 | 0 | 8.8 | 3.5 | 0 | 0 |
| α-Al$_2$O$_3$ | 0 | 0 | 93.5 | 0 | 0 | 1.47 | 2.06 | 0 | 1.47 | 1.47 |
| α-Al$_2$O$_3$ | 0 | 0 | 93.1 | 0 | 0 | 1.12 | 2.68 | 0.40 | 1.34 | 1.34 |

Sample A2 (Invention):

The substrates were deposited with a coating of the following layers starting from the surface of the substrate: 0.5 μm TiN, 4.7 μm T$_{1-x}$Al$_x$N, 0.25 μm TiN, 0.6 μm TiCN, 3.0 μm α-Al$_2$O$_3$. The deposition conditions are shown in Table 1a2 and 1b2.

The basic TiN layer was deposited at a temperature of 850° C. on the substrate. The reaction gases comprise TiCl$_4$, N$_2$, H$_2$.

The T$_{1-x}$Al$_x$N layer was deposited at a temperature of 700° C. The reaction gases comprise TiCl$_4$, AlCl$_3$, NH$_3$, H$_2$.

The intermediated TiN layer is then deposited directly on top of the T$_{1-x}$Al$_x$N layer at a temperature of 700° C. The reaction gases comprise TiCl$_4$, NH$_3$, H$_2$.

The TiCN layer is then deposited directly on top of the intermediate TiN layer at a temperature of 850° C. The reaction gases comprise TiCl$_4$, CH$_3$CN, N$_2$, H$_2$.

As a bonding layer the TiCN layer was oxidized in an oxidation step using CO, CO$_2$ and H$_2$.

The α-Al$_2$O$_3$ layer is then deposited on top of the bonding layer at a temperature of 850° C. The reaction gases comprise AlCl$_3$, CO$_2$, H$_2$, HCl, H$_2$S, CO. The deposition of the α-Al$_2$O$_3$ layer was carried out in two deposition steps, wherein in the first step a nucleation layer is grown, and in the second step the α-Al$_2$O$_3$ layer is grown to the desired thickness.

TABLE 1a2

Process parameters during deposition on Sample A2

| Layer | Temp [° C.] | Pressure [mbar] | Time [min] |
|---|---|---|---|
| TiN | 850 | 150 | 90 |
| Ti$_{1-x}$Al$_x$N | 700 | 7 | 75 |
| TiN | 700 | 7 | 10 |
| TiCN | 850 | 75 | 10 |
| Oxidation | 850 | 75 | 5 |
| α-Al2O3 | 850 | 75 | 30 |
| α-Al2O3 | 850 | 100 | 240 |

TABLE 1b2

Reaction gases during deposition on Sample A2

| Layer | TiCl$_4$ | N$_2$ | H$_2$ | CH$_3$CN | NH$_3$ [vol %] | AlCl$_3$ | CO$_2$ | CO | H$_2$S | HCl |
|---|---|---|---|---|---|---|---|---|---|---|
| TiN | 1.03 | 44.0 | 55.0 | 0 | 0 | 0 | 0 | 0 | 0 | 0 |
| Ti$_{1-x}$Al$_x$N | 0.019 | 0 | 99.5 | 0 | 0.35 | 0.17 | 0 | 0 | 0 | 0 |
| TiN | 0.20 | 0 | 98.8 | 0 | 1.0 | 0 | 0 | 0 | 0 | 0 |
| TiCN | 1.60 | 9.8 | 88.2 | 0.42 | 0 | 0 | 0 | 0 | 0 | 0 |
| Oxidation | 0 | 0 | 87.7 | 0 | 0 | 0 | 8.8 | 3.5 | 0 | 0 |
| α-Al$_2$O$_3$ | 0 | 0 | 93.5 | 0 | 0 | 1.47 | 2.06 | 0 | 1.47 | 1.47 |
| α-Al$_2$O$_3$ | 0 | 0 | 93.1 | 0 | 0 | 1.12 | 2.68 | 0.40 | 1.34 | 1.34 |

Sample B1 (Reference):

Cemented carbide substrates were deposited with coating of the following layers starting from the surface of the substrate: 0.4 μm TiN, 7.8 μm TiCN, 1.3 μm TiAlCNO, 3.4 μm α-Al$_2$O$_3$. Both the deposition of the TiCN and the α-Al$_2$O$_3$ layer was carried out in two deposition steps, wherein in the first step a nucleation layer is grown, and in the second step the layer is grown to the desired thickness. The deposition conditions are shown in Table 2a1 and 2b1.

TABLE 2a1

Process parameters during deposition on Sample B1

| Layer | Temp [° C.] | Pressure [mbar] | Time [min] |
|---|---|---|---|
| TiN | 920 | 160 | 45 |
| TiCN | 900 | 60 | 44 |
| TiCN | 900 | 90 | 110 |
| TiAlCNO | 1010 | 120 | 35 |
| Oxidation | 1010 | 65 | 5 |
| α-Al$_2$O$_3$ | 1015 | 65 | 30 |
| α-Al$_2$O$_3$ | 1015 | 65 | 180 |

TABLE 2b1

Reaction gases during deposition on Sample B1

| Layer | TiCl$_4$ | N$_2$ | H$_2$ | CH$_3$CN | AlCl$_3$ [vol %] | CO$_2$ | CO | H$_2$S | HCl | CH$_4$ |
|---|---|---|---|---|---|---|---|---|---|---|
| TiN | 1.08 | 39.1 | 59.8 | 0 | 0 | 0 | 0 | 0 | 0 | 0 |
| TiCN | 2.68 | 41.4 | 55.2 | 0.68 | 0 | 0 | 0 | 0 | 0 | 0 |
| TiCN | 1.65 | 12.8 | 85.5 | 0.55 | 0 | 0 | 0 | 0 | 0 | 0 |
| TiAlCNO | 0.84 | 2.76 | 91.8 | 0 | 0.74 | 0 | 1.11 | 0 | 0 | 2.76 |
| Oxidation | 0 | 0 | 98.5 | 0 | 0 | 0.71 | 0.79 | 0 | 0 | 0 |
| α-Al$_2$O$_3$ | 0 | 0 | 90.9 | 0 | 2.57 | 2.97 | 1.58 | 0 | 1.98 | 0 |
| α-Al$_2$O$_3$ | 0 | 0 | 91.0 | 0 | 2.38 | 3.97 | 0 | 0.32 | 2.38 | 0 |

Sample B2 (Reference):

Cemented carbide substrates were deposited with coating of the following layers starting from the surface of the substrate: 0.3 μm TiN, 4.6 μm TiCN, <0.1 μm TiAlCNO, 2.4 μm α-Al$_2$O$_3$. The deposition conditions are shown in Table 2a2 and 2b2.

TABLE 2a2

Process parameters during deposition on Sample B2

| Layer | Temp [° C.] | Pressure [mbar] | Time [min] |
|---|---|---|---|
| TiN | 800 | 600 | 90 |
| TiCN | 800 | 80 | 120 |
| TiAlCNO | 800 | 70 | 20 |
| Oxidation | 800 | 75 | 4 |
| α-Al$_2$O$_3$ | 800 | 55 | 30 |
| α-Al$_2$O$_3$ | 800 | 200 | 240 |

TABLE 2b2

Reaction gases during deposition on Sample B2

| Layer | TiCl$_4$ | N$_2$ | H$_2$ | CH$_3$CN | AlCl$_3$ [vol %] | CO$_2$ | CO | H$_2$S | HCl | CH$_4$ |
|---|---|---|---|---|---|---|---|---|---|---|
| TiN | 1.80 | 29.5 | 68.7 | 0 | 0 | 0 | 0 | 0 | 0 | 0 |
| TiCN | 2.63 | 32.2 | 64.4 | 0.83 | 0 | 0 | 0 | 0 | 0 | 0 |
| TiAlCNO | 2.59 | 26.4 | 64.5 | 0.57 | 0.66 | 0 | 3.97 | 0 | 1.32 | 0 |
| Oxidation | 0 | 31.8 | 57.1 | 0 | 0 | 3.17 | 7.94 | 0 | 0 | 0 |
| α-Al$_2$O$_3$ | 0 | 14.6 | 80.7 | 0 | 1.17 | 2.05 | 0 | 0 | 1.46 | 0 |
| α-Al$_2$O$_3$ | 0 | 0 | 95.7 | 0 | 1.02 | 2.16 | 0 | 0.38 | 0.76 | 0 |

Figure 2:
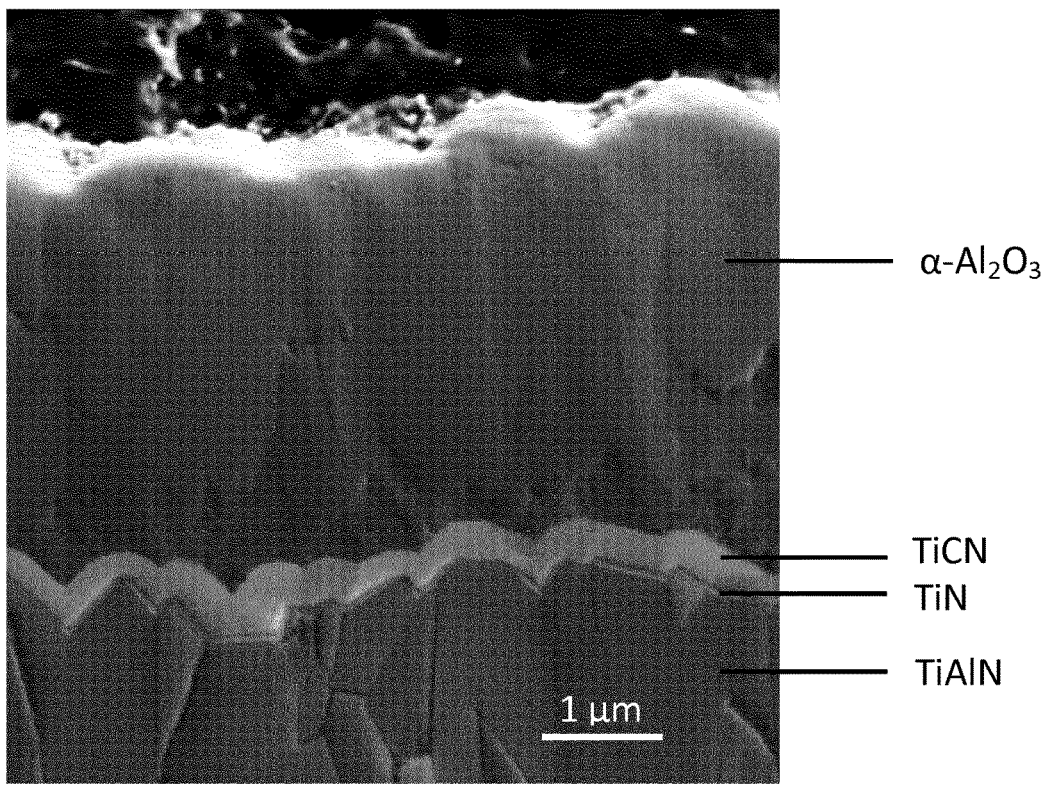
FIG. 2 shows a scanning electron microscope (SEM) image of a through cut of sample A1 (invention).

Cross-section SEM microphotographs were prepared from the coatings and cross sections of Sample A1 are shown in FIGS. 1 and 2. The Ti$_{1-x}$Al$_x$N layers of Sample A1 and Sample A2 are Ti$_{0.15}$Al$_{0.85}$N layers, i.e. x=0.85.

Coating Analyzes and Results

The coatings were analyzed in X-ray diffraction measurements.

X-ray diffraction measurements were performed in a XRD3003 PTS diffractometer of GE Sensing and Inspection Technologies using CuKα-radiation. The X-ray tube was run in point focus at 40 kV and 40 mA. A parallel beam optic using a polycapillary collimating lens with a measuring aperture of fixed size was used on the primary side whereby the irradiated area of the sample was defined in such manner that a spill over of the X-ray beam over the coated face of the sample was avoided. On the secondary side a Soller slit with a divergence of 0.4° and a 25 μm thick Ni K$_\beta$ filter was used. Thin film correction and absorption correction were made and the linear absorption coefficient used was $\mu^{\alpha-Al2O3}$=0.01258 μm$^{-1}$ and $\mu^{TiCN}$=0.08048 μm$^{-1}$ and $\mu^{TiAlN}$=0.02979 μm$^{-1}$. Absorption of the overlaying layers was considered and corrected for.

TABLE 3

| | TC values | | | |
|---|---|---|---|---|
| Ti$_{1-x}$Al$_x$N layer | TC(1 1 1) | TC(2 0 0) | TC(2 2 0) | TC(3 1 1) |
| Sample A1 | 3.77 | 0.02 | 0.06 | 0.15 |
| Sample A2 | 3.04 | 0 | 0.07 | 0.89 |
| TiCN layer | TC(1 1 1) | TC(2 0 0) | TC(2 2 0) | TC(3 1 1) |
| Sample A1 | 3.43 | 0.02 | 0.06 | 0.15 |
| Sample A2 | 3.51 | 0.19 | 0.10 | 0.20 |
| Sample B1 | 1.34 | 0.11 | 0.35 | 2.21 |
| Sample B2 | 2.63 | 0.12 | 0.62 | 0.63 |

TABLE 3-continued

| | TC values | | | |
|---|---|---|---|---|
| α-Al$_2$O$_3$ layer | TC(0 2 4) | TC(1 1 6) | TC(3 0 0) | TC(0 0 12) |
| Sample A1 | 0.05 | 0.05 | 0 | 3.90 |
| Sample A2 | 0.01 | 0.04 | 0 | 3.95 |

TABLE 3-continued

| | TC values | | | |
|---|---|---|---|---|
| Sample B1 | 1.64 | 0.55 | 0.16 | 1.65 |
| Sample B2 | 0.01 | 0.01 | 0 | 3.98 |

Furthermore, texture and grain boundary orientation of the coatings were analyzed by electron backscatter diffraction (EBSD). For this purpose the coating surfaces (samples) were first polished subsequently using slurries of diamond having average grain sizes of 6 μm, 3 μm and 1 μm, respectively. Then, the samples were polished using colloidal silica having an average grain size of 0.04 μm. The last polishing step was done manually, and polishing time was increased stepwise until the sample quality was good enough to perform the EBSD maps, i.e. indexing of EBSD patterns would be accomplished with an average confidence index (CI)>0.2 at typical scan rates of 15-35 frames per second. The precise preparation conditions will depend on the individual sample and equipment, and can easily be determined by a person skilled in the art. Care was taken to ensure that the polished surfaces were smooth and parallel to the original coating surface. Finally, the samples were ultrasonically cleaned before EBSD examination.

Planar surfaces on the rake face were used for the polishing, and the EBSD measurements were performed at distances <250 μm from the cutting edge of the insert. Due to the roughness of the cemented carbide substrate, areas of the lower TiCN or $T_{1-x}Al_xN$ layers of the coatings according to the examples above were exposed as well. EBSD maps were acquired with an EDAX system (Digiview IV camera) using 8×8 or lower binning and typical scan rates of 15-35 frames per second on a Zeiss Supra 40 VP field emission scanning electron microscope using a 60 μm aperture, 15 kV acceleration voltage, high current mode and working distances between 6 mm and 15 mm. Areas for EBSD measurement of the upper $\alpha$-$Al_2O_3$ layers, TiCN layers or $T_{1-x}Al_xN$ layers were chosen by inspection of the surface in the SEM according to atomic number contrast. The maps had sizes of at least 10×10 μm, and step size ≤0.04 μm. Measurement of the upper $\alpha$-$Al_2O_3$ layers was thus performed at a remaining layer thickness of 30% to 70% of the grown thickness. This was checked after polishing and EBSD measurement by preparing a cross section through the area where EBSD map had been acquired using a focused ion beam (FIB), and taking an average of >5 thickness measurements evenly distributed over the width of the EBSD map. The information depth of the electron diffraction patterns is small (on the order of a few tens of nanometers) compared to the layer thicknesses. The measurement depth of the TiCN layers in samples B1 and B2 was 0.5-1 μm below the interface between TiCN and $\alpha$-$Al_2O_3$. For sample A2, EBSD maps of the 0.6 μm thick TiCN layer could be acquired and processed. The texture information thus obtained represents an approximate average over the TiCN layer thickness. Since the texture of the TiCN layer in sample A2 is given by epitaxy to the underlying $T_{1-x}Al_xN$ layer, there is no significant texture gradient in the TiCN layer. The texture and epitaxial relations were checked by EBDS analysis in cross section. For sample A1, no EBSD map of the TiCN layer could be acquired due to too low thickness. Also in this case, texture and grain boundary orientation of the TiCN layer are defined by the underlying $T_{1-x}Al_xN$ layer, as indicated by EBSD cross sectional analysis and by the XRD results given in table 3-1.

For data acquisition and analysis, the software packages OIM Data Collection 7.3.1 and OIM Analysis 7.3.1 from EDAX were used, respectively. From the data orientation distribution functions were calculated and plotted as 001 inverse pole figures to evaluate the preferential crystallographic orientation. The $\alpha$-$Al_2O_3$ layers of samples A1, A2 and B2 had strong {0001} fiber textures, whereas sample B1 had a weak bimodal texture showing intensity maxima around {0001} and {01-12} in the inverse pole figure. TiCN layers of the coatings according to the invention had strong {111} texture, whereas TiCN-layers of the comparative samples had {211} texture. The strength and sharpness of the fiber texture is characterized by the maximum intensity in the 001 inverse pole figure appearing at the direction of preferential crystallographic orientation.

For the evaluation of grain boundary orientation, $\Sigma N$ grain boundaries were identified. The Brandon criterion ($\Delta\Theta<\Theta_0(\Sigma)^{-0.5}$, where $\Theta_0=15°$) was used to account for the allowed deviations $\Delta\Theta$ of experimental values from the theoretical values (D. Brandon, Acta metall. 14 (1966) 1479-1484.). The amount of $\Sigma 3$ grain boundaries in the layers was calculated as fraction of $\Sigma 3/\Sigma N$ (N≤9) for $\alpha$-$Al_2O_3$ layers. The $\Sigma N$ (N≤49) boundaries used in the calculation for $\alpha$-$Al_2O_3$ correspond to the common lattice rotations in rhombohedral lattice materials given in H. Grimmer, Acta Crystallographica A (1989), A45, 505-523. In addition, the amount of $\Sigma 3$ grain boundaries was calculated as the fraction of $\Sigma 3$ grain boundary length to the total grain boundary length.

For the present invention and the definitions herein, the ODF calculation and texture calculation, as well as $\Sigma$-values for the calculation of $\Sigma$-type grain boundaries are based on EBSD data without noise reduction or other cleanup procedures which alter the indexing and orientation data. Care should be taken that specimen preparation is carried out as described here with sufficient smoothness.

The results of EBSD measurements are given in table 4. It is notable that in the coatings according to the invention, the $\alpha$-$Al_2O_3$ layers have a much higher fraction of $\Sigma 3$ grain boundaries with respect to the total grain boundary length.

TABLE 4

EBSD data

| Sample | Layer | Texture | Max. intensity in 001 inverse pole figure [times average] | $\Sigma 3/\Sigma N$ [%] | $\Sigma 3$/total grain boundary length [%] |
|---|---|---|---|---|---|
| A1 | $\alpha$-$Al_2O_3$ | 001 | 28.0 | 98 | 37 |
| | TiCN | 111 | not measurable | not measurable | not measurable |
| A2 | $\alpha$-$Al_2O_3$ | 001 | 35.0 | 97 | 41 |
| | TiCN | 111 | 6.53 | 12 | 3 |
| B1 | $\alpha$-$Al_2O_3$ | 001 | 2.4 | 78 | 9 |
| | TiCN | 211 | 2.60 | 49 | 20 |
| B2 | $\alpha$-$Al_2O_3$ | 001 | 30.8 | 91 | 14 |
| | TiCN | 211 | 4.51 | 51 | 22 |

Wear Test

Cemented carbide inserts of the geometry CNMA120408 were coated as disclosed above. The inserts were tested in a turning test against 56NiCrMo steel without coolant. The following cutting parameters were used:

Cutting speed, $v_c$: 150 m/min
Feed, f: 0.32 mm
Depth of cut, $a_p$: 2.5 mm

The samples A1 and B1 were tested in longitudinal turning. One and the same cutting edge was run for 3 minutes, removed and analyzed in a LOM, remounted and run again for 3 minutes. This was repeated 4 times such that a total cutting time of 12 minutes was reached. The flank wear of the cutting edges (VB$_{max}$) as an average of two repeats are shown in table 5.

TABLE 5

| Tool | Flank wear, VB$_{max}$ [mm] |
|---|---|
| A1 (invention) | 0.16 |
| B1 (reference) | 0.25 |

While the invention has been described in connection with various exemplary embodiments, it is to be understood that the invention is not to be limited to the disclosed exemplary embodiments, on the contrary, it is intended to cover various modifications and equivalent arrangements within the appended claims. Furthermore, it should be recognized that any disclosed form or embodiment of the invention may be incorporated in any other disclosed or described or suggested form or embodiment as a general matter of design choice. It is the intention, therefore, to be limited only as indicated by the scope of the appended claims appended hereto.

The invention claimed is:
1. A coated cutting tool comprising:
a substrate; and
a coating, wherein the coating has an inner layer of 4-14 µm thick Ti$_{1-x}$Al$_x$N, an intermediate layer of 0.05-1 µm TiCN and at least one outer layer of 1-9 µm α-Al$_2$O$_3$, wherein the TiCN layer is in epitaxial relation to the Ti$_{1-x}$Al$_x$N layer, and wherein said α-Al$_2$O$_3$ layer exhibits an X-ray diffraction pattern, as measured using CuKα radiation and theta-2theta scan, and a texture coefficient TC(hkl) being defined according to Harris formula

$$TC(hkl) = \frac{I(hkl)}{I0(hkl)}\left[\frac{1}{n}\sum_{i=0}^{n}\frac{I(hkl)}{I0(hkl)}\right]^{-1}$$

wherein the (hkl) reflections used are (0 2 4), (1 1 6), (3 0 0) and (0 0 12),
I(hkl)=measured intensity (peak intensity) of the (hkl) reflection,
10(hkl)=standard intensity according to ICDD's PDF-card No. 00-042-1468,
n=number of reflections used in the calculation,
wherein 3<TC(0 0 12)<4.

2. The tool according to claim 1, wherein the thickness of the intermediate layer of TiCN is 0.05-0.3 µm.

3. The tool according to claim 1, wherein the TC(111) of the intermediate layer of TiCN is >3, and wherein the texture coefficient TC (111) is defined as:

$$TC(111) = \frac{I(111)}{I_0(111)}\left[\frac{1}{n}\sum_{n=1}^{n}\frac{I(hkl)}{I_0(hkl)}\right]^{-1}$$

wherein
I(hkl) are the intensities of the diffraction reflections measured by X-ray diffraction,
I$_0$(hkl) are the standard intensities of the diffraction reflections according to the pdf card 00-042-1489
n is the number of reflections used in the calculation, and for the calculation of TC(111) the reflections (111), (200), (220) and (311) are used.

4. The tool according to claim 1, wherein the Σ3 grain boundary length to the total grain boundary length in the α-Al$_2$O$_3$ layer is >30%.

5. The tool according to claim 1, wherein the Ti$_{1-x}$Al$_x$N layer has at least 90 vol-% face-centered cubic (fcc) crystal structure.

6. The tool according to claim 1, wherein the Ti$_{1-x}$Al$_x$N layer has a columnar microstructure.

7. The tool according to claim 1, wherein precipitations of Ti$_{1-y}$Al$_y$N are present at grain boundaries of the Ti$_{1-x}$Al$_x$N crystallites, said precipitations having a higher Al content than inside crystallites and comprise AN with hexagonal crystal structure (hcp) wherein y>x.

8. The tool according to claim 1, wherein the Ti$_{1-x}$Al$_x$N layer has stoichiometric coefficients of 0.60≤x≤0.90.

9. The tool according to claim 1, wherein the Ti$_{1-x}$Al$_x$N layer has a orientation of the crystal growth with respect to a crystallographic {111} plane, characterized by a texture coefficient TC (111) >3, wherein the texture coefficient TC (111) is defined as follows:

$$TC(111) = \frac{I(111)}{I_0(111)}\left[\frac{1}{n}\sum_{n=1}^{n}\frac{I(hkl)}{I_0(hkl)}\right]^{-1}$$

wherein
I(hkl) are the intensities of the diffraction reflections measured by X-ray diffraction,
I$_0$(hkl) are the standard intensities of the diffraction reflections according to the pdf card 00-046-1200,
n is the number of reflections used in the calculation, and for the calculation of TC(111) the reflections (111), (200), (220) and (311) are used.

10. The tool according to claim 1, wherein the thickness of the TiCN layer is 0.1-0.3 µm.

11. The tool according to claim 1, wherein an average aspect ratio of the TiCN grains of the TiCN layer is ≤1.

12. The tool according to claim 1, wherein a coating thickness relation of the Ti$_{1-x}$Al$_x$N layer, t(Ti$_{1-x}$Al$_x$N), in relation to the thickness of the α-Al$_2$O$_3$ layer, t(α), is t(Ti$_{1-x}$Al$_x$N):t(α) from 2:1 to 3:1.

13. The tool according to claim 1, wherein the coating includes an innermost layer of TiN, a thickness of the innermost layer of TiN being 0.1-2 µm.

14. The tool according to claim 1, wherein the substrate is cemented carbide.

* * * * *